(12) United States Patent
Watanabe et al.

(10) Patent No.: US 11,367,813 B2
(45) Date of Patent: Jun. 21, 2022

(54) RESIN PACKAGE AND SEMICONDUCTOR LIGHT-EMITTING DEVICE

(71) Applicant: STANLEY ELECTRIC CO., LTD., Tokyo (JP)

(72) Inventors: Seishi Watanabe, Tokyo (JP); Daisuke Yoshimi, Tokyo (JP); Kohei Tai, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 368 days.

(21) Appl. No.: 16/225,417

(22) Filed: Dec. 19, 2018

(65) Prior Publication Data

US 2019/0198731 A1 Jun. 27, 2019

(30) Foreign Application Priority Data

Dec. 22, 2017 (JP) .............................. JP2017-246310

(51) Int. Cl.
*H01L 33/56* (2010.01)
*H01L 33/48* (2010.01)
(Continued)

(52) U.S. Cl.
CPC ............ *H01L 33/56* (2013.01); *H01L 21/565* (2013.01); *H01L 33/486* (2013.01);
(Continued)

(58) Field of Classification Search
CPC ....... H01L 33/48–486; H01L 33/52–56; H01L 33/60; H01L 33/62; H01L 2224/48091; H01L 2224/48227; H01L 2224/48247; H01L 33/46; H01L 33/50; H05K 2201/0999

See application file for complete search history.

(56) References Cited

U.S. PATENT DOCUMENTS 6,392,294 B1* 5/2002 Yamaguchi ............ H01L 33/54
257/690
8,143,531 B2* 3/2012 Miki ................. H01L 23/49822
174/260

(Continued)

FOREIGN PATENT DOCUMENTS

JP 2007329249 A 12/2007
JP 2013153182 A 8/2013

*Primary Examiner* — Michael M Trinh
(74) *Attorney, Agent, or Firm* — Holtz, Holtz & Volek PC

(57) ABSTRACT

Reliable resin packages and semiconductor light-emitting devices using the resin package can include a printed circuit board including a resin layer, metallic layers formed on a top surface of the resin layer and underneath a bottom surface of the resin layer and a frame arranged from a top surface of the printed circuit board toward a bottom surface of the printed circuit board. The semiconductor light-emitting device using the resin package can prevent the printed circuit board from warping toward the frame when forming the frame incorporating the printed circuit board because a total of each thickness of the metallic layers formed on the top surface and underneath the bottom surface of the resin layer can be thicker than a thickness of the resin layer. Thus, the present invention can provide the semiconductor light-emitting devices having high reliability, which can be used as a light source for vehicle lamps, etc.

6 Claims, 11 Drawing Sheets

(51) Int. Cl.
*H05K 5/00* (2006.01)
*H05K 1/03* (2006.01)
*H05K 5/02* (2006.01)
*H01L 21/56* (2006.01)
*H01L 33/32* (2010.01)
*H01L 33/62* (2010.01)

(52) U.S. Cl.
CPC ......... *H05K 1/0313* (2013.01); *H05K 5/0091* (2013.01); *H05K 5/02* (2013.01); *H01L 33/325* (2013.01); *H01L 33/62* (2013.01); *H05K 2201/0999* (2013.01)

(56) References Cited

U.S. PATENT DOCUMENTS

| | | | | |
|---|---|---|---|---|
| 2008/0023815 | A1* | 1/2008 | Asai | H05K 3/465 |
| | | | | 257/687 |
| 2009/0022198 | A1* | 1/2009 | Chen | H01L 33/486 |
| | | | | 372/49.01 |
| 2013/0049061 | A1* | 2/2013 | Takeda | H01L 33/486 |
| | | | | 257/99 |
| 2019/0013443 | A1* | 1/2019 | Nakabayashi | H01L 33/62 |
| 2019/0088824 | A1* | 3/2019 | Kim | H01L 33/52 |
| 2019/0143434 | A1* | 5/2019 | Yoneda | H01L 23/53214 |
| | | | | 257/741 |

* cited by examiner

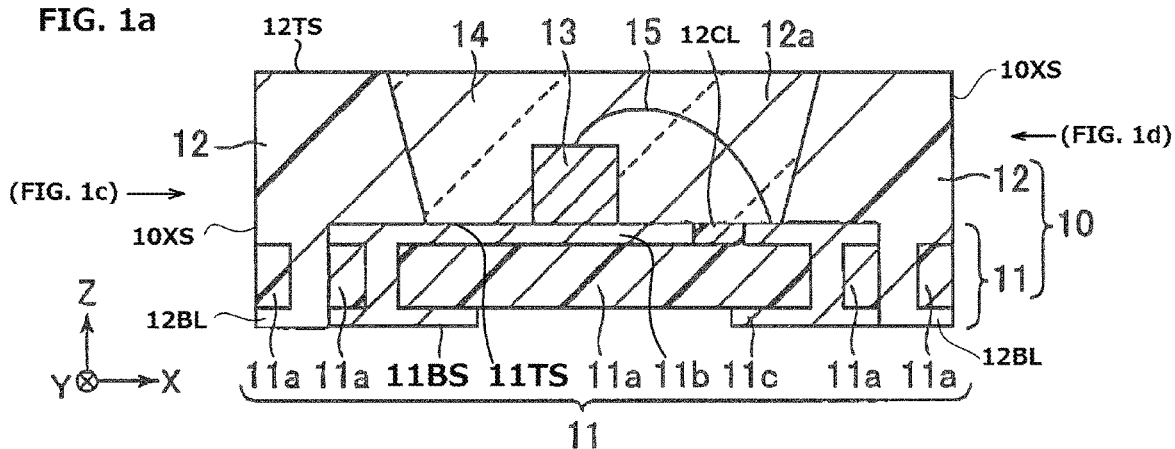
FIG. 1a
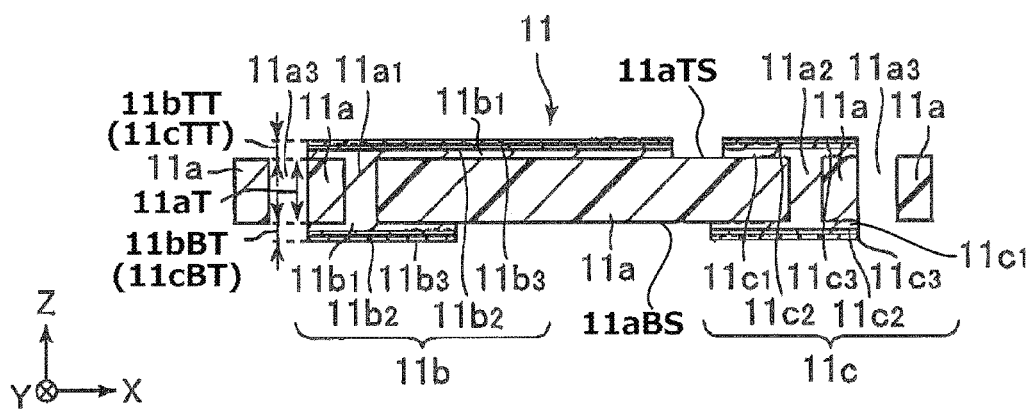
FIG. 1b
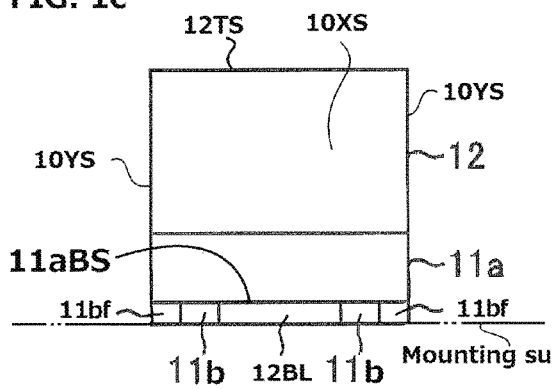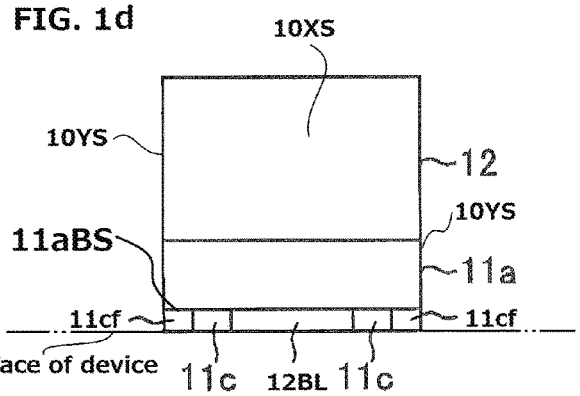
FIG. 1c    FIG. 1d

RESIN PACKAGE AND SEMICONDUCTOR LIGHT-EMITTING DEVICE

This application claims the priority benefit under 35 U.S.C. § 119 of Japanese Patent Application No. 2017-246310 filed on Dec. 22, 2017, which is hereby incorporated in its entirety by reference.

BACKGROUND

1. Field

The present invention relates to resin packages and semiconductor light devices, and more particularly to the resin packages having a high quality and the semiconductor light-emitting devices using the resin package having the high quality such as a reliability, an assembly accuracy, and the like. Thus, the semiconductor light-emitting devices can be used as a reliable light source having a high light-efficiency for vehicle lamps, a general lighting, a backlighting unit for a liquid crystal display, etc.

2. Description of the Related Art

Semiconductor light-emitting devices including a semiconductor light-emitting chip mounted in a resin package and manufacturing methods for the device are well known as disclosed in Patent Document No. 1 (Japanese Patent Application Laid Open No. 2013-153,182), Patent Document No. 2 (Japanese Patent Application Laid Open No. 2007-329, 249), etc. FIG. 6a is a schematic cross-sectional front view depicting a conventional semiconductor light-emitting device disclosed in Patent Document No. 2, in which the cross-sectional front view shows the device along a direction of X-axis as shown in FIG. 6a. FIG. 6b is a schematic side view depicting the conventional semiconductor light-emitting device, and which shows the device from a direction of X-axis along Y-axis as shown in FIG. 6b. Each of X-axis, Y-axis and Z-axis intersects at a right angle with respect to each other.

The conventional semiconductor light-emitting device may include: a resin package 30 having a cavity 32a; a semiconductor light-emitting chip 33 mounted in the cavity 32a of the resin package 30; and an encapsulating resin 34 disposed in the cavity 32a of the resin package 30 so as to encapsulate the semiconductor light-emitting chip 33. The resin package 30 may include: a printed circuit board 31; a frame 32 arranged on the printed circuit board 31; and the cavity 32a thereof located so as to be surrounded by the frame 32 on the printed circuit board 31.

The printed circuit board 31 may include: a resin layer 31a formed by impregnating a glass cloth with an epoxy resin; a first metallic layer 31b used as a first conductor pattern; a second metallic layer 31c used as a second conductor pattern. Each of the first metallic layer 31b and the second metallic layer 31c may be metallic layers having a laminate structure of, for example, Copper (Cu), nickel (Ni) and Gold (Au), and also may be electrically insulated with respect to each other. The frame 32 may be made from an epoxy resin including a light-reflecting material such as titanium oxide, etc.

On the first metallic layer 31b of the printed circuit board 31 exposed from the cavity 32a of the resin package 30, for example, a light emitting diode (LED) used as the semiconductor light-emitting chip 33 may be mounted by a die-bonding method. The semiconductor light-emitting chip 33 may include: n-type semiconductor layer formed from n-type GaN in which Si and the like is doped; an emission layer made from a multiple quantum well structure, which includes a quantum well layer formed from InGaN and a barrier layer formed from GaN; p-type semiconductor layer formed from p-type GaN in which Mg and the like is doped; n-type electrode electrically connected to the n-type semiconductor layer; and p-type electrode electrically connected to the p-type semiconductor layer. The semiconductor light-emitting chip 33 may be a blue LED chip emitting blue light.

By die-bonding the semiconductor light-emitting chip 33 on the first metallic layer 31b of the printed circuit board 31, one of the n-type electrode and the p-type electrode may be electrically connected to the first metallic layer 31b, and another of the n-type electrode and the p-type electrode may be electrically connected to the second metallic layer 31c of the printed circuit board 31 via a bonding wire 35. The encapsulating resin 34 may be disposed in the cavity 32a of the resin package 30 to encapsulate the semiconductor light-emitting chip 33 and the like as shown in FIG. 6a.

The encapsulating resin 34 may include a wavelength converting material such as a phosphor material of yttrium aluminum garnet $Y_3Al_5O_{12}$:Ce (YAG:Ce), etc. In this case, a part of the blue light emitted from the semiconductor light-emitting chip 33 may enter into the phosphor material and may be wavelength-converted into a different wavelength from a wavelength of the blue light. Light having the different wavelength may be emitted from a top surface of the encapsulating resin 34 (i.e. a light-emitting surface of the semiconductor light-emitting device) in an outward direction of the device along with another part of the blue light, which may not enter into the phosphor material.

When the YAG:Ce is used as the wavelength converting material, the semiconductor light-emitting device may emit substantially white light by an additive color mixture of the excited yellow light emitted from the yellow phosphor material and the other part of the blue light emitted from the blue LED chip. In this case, light reached to the frame 32 in the lights emitted from the semiconductor light-emitting chip 33 may be reflected by the frame 32 and may be emitted from the top surface of the encapsulating resin 34 in the outward direction of the device.

However, the above-described conventional semiconductor light-emitting device may include some challenges for manufacturing process, etc. When an individual device is cut from a plurality of the semiconductor light-emitting devices in a singulating process, burrs 31d may occur as shown in FIG. 6b, because the first and the second metallic layers 31b and 31c are expanded by a heat generated from a blade in the singulating process. FIG. 6b shows exemplary burrs 31d at outer ends of the second metallic layer 31c toward expanding spaces of the second metallic layer 31c. The burrs 31 may cause degradations of an assemble accuracy, a mounting reliability of the device, etc.

In addition, when the frame 32 is formed on the printed circuit board 31 using an epoxy resin, the printed circuit board 31 may warp in a direction toward the frame 32 due to a curing shrink of the epoxy resin. Moreover, a part of the resin layer 31a of the printed circuit board 31 exposed from the cavity 32a of the resin package 30 may not include the light-reflecting material such as titanium oxide and the like. Accordingly, because a reflectance of light entering into the part of the resin layer 31a may be low, a light-emitting efficiency of the conventional semiconductor light-emitting device may decrease. Furthermore, the blue light may degrade a quality of the epoxy resin, which forms the frame 32. Therefore, the conventional semiconductor light-emitting device may decrease the light-emitting efficiency thereof because it may be easy for the debased epoxy resin to absorb the yellow light wavelength-converted by the yellow phosphor contained in the encapsulating resin 34.

The above-referenced Patent Documents are listed bellow and are hereby incorporated with their abstract in their entirety.
1. Patent Document No. 1: Japanese Patent Application Laid Open No. 2013-153,182
2. Patent Document No. 1: Japanese Patent Application Laid Open No. 2007-329,249

The presently invention has been devised to consider the above and other problems, characteristics and features. Exemplary embodiments of the present invention can include providing resin packages having a high quality such that can be used for semiconductor light-emitting devices having a high quality and a high light-emitting efficiency. More specifically, the embodiments can include the semiconductor light-emitting devices, which may prevent metallic layers from causing burrs, which create an adverse result, in manufacturing processes for the devices, and which may prevent the printed circuit board mounting the semiconductor light-emitting chip from warps in manufacturing processes for the devices. Thus, the present invention can provide the semiconductor light-emitting devices having high reliability and a high light-emitting efficiency

SUMMARY

The presently invention has been devised in view of the above and other characteristics, desires, and problems in the conventional art. An aspect of the present invention can include resin packages having a high quality, which can be used for semiconductor light-emitting devices having high reliability and a high light-emitting efficiency. Another aspect of the present invention can provide the semiconductor light-emitting devices using the resin package having the high quality, which can be used as reliable light sources for a general lighting, vehicle lamps, etc.

According to an aspect of the present invention, an exemplary resin package can include: a printed circuit board including a resin layer having a resin top surface and a resin bottom surface, and including metallic layers formed on the resin top surface of the resin layer and underneath the resin bottom surface of the resin layer; a frame arranged from a board top surface of the printed circuit board toward a board bottom surface of the printed circuit board; and wherein a total of each thickness of the metallic layers formed on the resin top surface and underneath the resin bottom surface is thicker than a thickness of the resin layer.

In the above-described exemplary resin package, the printed circuit board can include third through holes, and the frame can connect from the board top surface of the printed circuit board toward the board bottom surface of the printed circuit board. Additionally, the total of each thickness of the metallic layers formed on the resin top surface of the resin layer and underneath the resin bottom surface of the resin layer can be less than four times the thickness of the resin layer.

According to the above-described exemplary resin package, a stiffness of the printed circuit board can increase by thickening the metallic layers, and therefore the resin package can prevent the printed circuit board from warping toward the frame when forming the frame on the printed circuit board. Additionally, the frame can be also located in the both outward directions of the metallic layers while the present invention may decrease a cutting area of the metallic layers, and also may form the frame underneath the resin bottom layer of the resin layer. Accordingly, the present invention can prevent the resin package from causing burrs and a warpage of the printed circuit board. Thus, the present invention can provide the resin packages having a high quality, which can be used for semiconductor light-emitting devices having high reliability and a high light-emitting efficiency.

According to another aspect of the present invention, an exemplary semiconductor light-emitting device using the resin package can further include: a cavity in the resin package; a semiconductor light-emitting chip located in the cavity; and an encapsulating resin disposed in the cavity of the resin package, wherein a frame cavity layer of the frame having a light-reflecting material is located between the metallic layers, which is located on the resin top surface of the resin layer so as to be used as a bottom surface of the cavity along with the metallic layers.

According to the semiconductor light-emitting device using the resin package, the semiconductor light-emitting device can emit various colored lights having high reliability and a high light-emitting efficiency from the semiconductor light-emitting chip mounted in the cavity of the resin package having the high quality. Thus, the present invention can provide the semiconductor light-emitting devices using the resin package, which can be used as reliable light sources for a general lighting, vehicle lamps, etc.

BRIEF DESCRIPTION OF THE DRAWINGS

These and other characteristics and features of the present invention will become clear from the following description with reference to the accompanying drawings, wherein:

FIG. 2c is a schematic cross-sectional front view showing the first exemplary structure of the resin package taken along Line A1-A1 shown in FIG. 2a, FIG. 2d is a schematic cross-sectional front view showing the first exemplary structure of the resin package taken along Line B1-B1 shown in FIG. 2a, FIG. 2e is a schematic front view showing the first exemplary structure of the resin package of FIG. 2a, FIG. 2f is a schematic cross-sectional side view showing the first exemplary structure of the resin package taken along Line C1-C1 shown in FIG. 2a, FIG. 2g is a schematic side view showing the first exemplary structure of the resin package of FIG. 2a, and FIG. 2h is a schematic rear view showing the first exemplary structure of the resin package of FIG. 2a;

FIG. 3c is a schematic cross-sectional front view showing the second exemplary structure of the resin package taken along Line A2-A2 shown in FIG. 3a, FIG. 3d is a schematic cross-sectional front view showing the second exemplary structure of the resin package taken along Line B2-B2 shown in FIG. 3a, FIG. 3e is a schematic front view showing the second exemplary structure of the resin package of FIG. 3a, FIG. 3f is a schematic cross-sectional side view showing the second exemplary structure of the resin package taken along Line C2-C2 shown in FIG. 3a, FIG. 3g is a schematic side view showing the second exemplary structure of the resin package of FIG. 3a, and FIG. 3h is a schematic rear view showing the second exemplary structure of the resin package of FIG. 3a;

FIG. 4c is a schematic cross-sectional front view showing the third exemplary structure of the resin package taken along Line A3-A3 shown in FIG. 4a, FIG. 4d is a schematic front view showing the third exemplary structure of the resin package of FIG. 4a, FIG. 4e is a schematic cross-sectional side view showing the third exemplary structure of the resin package taken along Line C3-C3 shown in FIG. 4a, FIG. 4f is a schematic side view showing the third exemplary structure of the resin package of FIG. 4a, and FIG. 4g is a schematic rear view showing the third exemplary structure of the resin package of FIG. 4a;

FIG. 5c is a schematic cross-sectional front view showing the fourth exemplary structure of the resin package taken along Line A4-A4 shown in FIG. 5a, FIG. 5d is a schematic front view showing the fourth exemplary structure of the resin package of FIG. 5a, FIG. 5e is a schematic cross-sectional side view showing the fourth exemplary structure of the resin package taken along Line C4-C4 shown in FIG. 5a, FIG. 5f is a schematic side view showing the fourth exemplary structure of the resin package of FIG. 5a, and FIG. 5g is a schematic rear view showing the fourth exemplary structure of the resin package of FIG. 5a.

DETAILED DESCRIPTION OF EXEMPLARY EMBODIMENTS

Figure 1E:
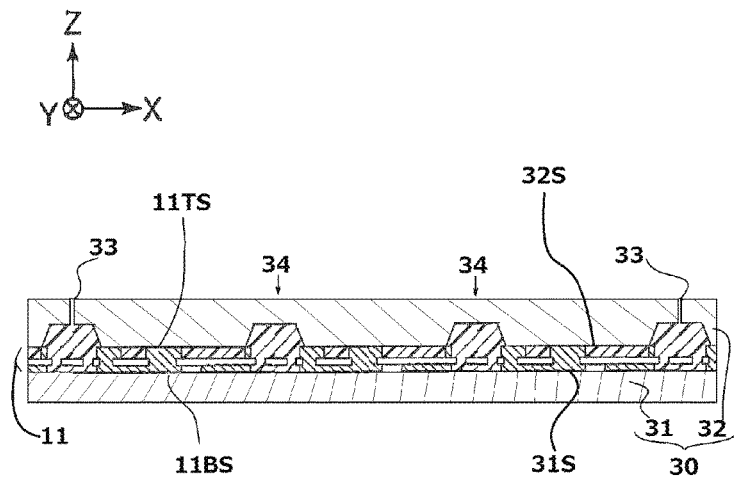
FIG. 1a is a schematic cross-sectional front view showing an exemplary embodiment of a semiconductor light-emitting device made in accordance with principles of the present invention.
FIG. 1b is a cross-sectional front view showing an exemplary printed circuit board shown in FIG. 1a, FIGS. 1c and 1d are schematic side views showing the semiconductor light-emitting device of FIG. 1a, FIG. 1e is a schematic cross-sectional front view showing an exemplary manufacturing method for the devices in a view from a direction of Y-axis along X-axis.
FIG. 1f is a schematic cross-sectional side view showing the exemplary manufacturing method in a view from a direction of X-axis along Y-axis.
FIG. 1g is a schematic cross-sectional front view showing an individual resin package.
FIG. 1h is a schematic cross-sectional side view showing the individual resin package shown in FIG. 1g.

The present invention will now be described in detail with reference to FIG. 1a to FIG. 5g, in which the same, similar, or corresponding elements use the same reference marks. FIG. 1a is a schematic cross-sectional front view showing an exemplary embodiment of a semiconductor light-emitting device made in accordance with principles of the present invention.

The semiconductor light-emitting device of the exemplary embodiment can include: a resin package 10 having first side surfaces 10XS and second side surfaces 10YS located in a direction perpendicular to the first side surfaces 10XS including a printed circuit board 11 having a board top surface 11TS and a board bottom surface 11BS, a frame 12 and a cavity 12a, the frame 12 having a frame top surface 12TS including a frame cavity layer 12CL and a frame bottom layer 12 BL, and each of the first side surfaces 10XS located on opposite side of X-axis direction with respect to each other; a semiconductor light-emitting chip 13 mounted in the cavity 12; an encapsulating resin 14 in the cavity 12a of the resin package 10; and wherein the frame 12 extends from the board top surface 11TS toward the board bottom surface 11BS of the printed circuit board 11.

FIG. 1b is a cross-sectional front view showing an exemplary printed circuit board shown in FIG. 1a. The printed circuit board 11 can include: a resin layer 11a having a resin top surface 11aTS and a resin bottom surface 11aBS used as a resin base material; a first metallic layer 11b used as a first conductor pattern, formed on the resin top surface 11aTS and underneath the resin bottom surface 11BS, extending from the resin top surface 11aTS toward the resin bottom surface 11aBS via a first through hole 11a1, and each of the first metallic layer 11b located on the resin top surface 11aTS and the first metallic layer 11b located underneath the resin bottom surface 11aBS being electrically connected via the first through hole 11a1; and a second metallic layer 11c used as a second conductor pattern, formed on the resin top surface 11aTS and underneath the resin bottom surface 11BS, extending from the resin top surface 11aTS toward the resin bottom surface 11aBS of the resin layer 11a via a second through hole 11a2, and each of the second metallic layer 11c located on the resin top surface 11aTS and the second metallic layer 11c located underneath the resin bottom surface 11aBS being electrically connected via the second through hole 11a2.

The resin layer 11a may be formed by impregnating a glass cloth with an epoxy resin, a silicone resin and the like, and a resin thickness 11aT of the resin layer 11a may be, for example, approximately 110 micrometers (μm). The resin layer 11a can include the first through hole 11a1, the second through hole 11a2 and third through holes 11a3, which pass through from the resin top surface 11aTS of the resin layer 11a to the resin bottom surface 11aBS of the resin layer 11a. The third through holes 11a3 can be used as passing holes of a thermoplastic resin of the frame 12 when the frame 12 is formed in a mold.

Each of the first metallic layer 11b and the second metallic layer 11c can pass through the resin layer 11a, and can be formed on the resin top surface 11aTS of the resin layer 11a and underneath the resin bottom surface 11aBS of the resin layer 11a. However, each of the first metallic layer 11b and the second metallic layer 11c can be insulated with respect to each other so as not to be electrically connected. Each of top metallic thicknesses 11bTT, 11cTT of the first metallic layer 11b and the second metallic layer 11c, which are formed on the resin top surface 11aTS of the resin layer 11a, can be, for example, approximately 170 μm, and also each of bottom metallic thicknesses 11bBT, 11cBT of the first metallic layer 11b and the second metallic layer 11c, which are formed underneath the resin bottom surface 11aBS of the resin layer 11a, can be, for example, approximately 100 μm.

In embodiments of the present invention, the printed circuit board 11 can be manufactured so that the resin thickness 11aT of the resin layer 11a is thinner than a total of the first top metallic thicknesses 11bTT and the first bottom metallic thickness 11bBT of the first metallic layer 11b, and also is thinner than a total of the second top metallic thicknesses 11cTT and the second bottom metallic thickness 11cBT of the second metallic layer 11c. In this case, each top thickness of the first metallic layer 11b and the second metallic layer 11c formed on the resin top surface 11aTS of the resin layer 11a can be substantially the same thickness, and also each bottom thickness of the first metallic layer 11b and the second metallic layer 11c formed underneath the resin bottom surface 11aBS of the resin layer 11a can be substantially the same thickness.

Each of the first metallic layer 11b and the second metallic layer 11c can include Copper (Cu) layer 11b1 and 11c1 on the resin top surface 11aTS of the resin layer 11a, respectively. Additionally, in each of the first metallic layer 11b and the second metallic layer 11c, each of nickel (Ni) layer 11b2 and 11c2 can be formed on Cu layer 11b1 and 11c1, respectively, and also each of Gold (Au) layer 11b3 and 11c3 can be formed on Ni layer 11b2 and 11c2, respectively. Similarly, each of the first metallic layer 11b and the second metallic layer 11c can include Cu layer 11b1 and 11c1 underneath the resin bottom surface 11aBS of the resin layer 11a, respectively. Each of Ni layer 11b2 and 11c2 can be formed underneath Cu layer 11b1 and 11c1, respectively, and also each of Au layer 11b3 and 11c3 can be formed underneath Ni layer 11b2 and 11c2, respectively, as shown in FIG. 1b.

More specifically, each of the first metallic layer 11b and the second metallic layer 11c can be formed in a laminate structure of Au layer 11b3 and 11c3 having a thickness of approximately 0.1 μm, Ni layer 11b2 and 11c2 having a thickness of approximately 10 μm and Cu layer 11b1 and 11c1 having a thickness of approximately 90 μm in turn from the board bottom surface 11BS of the printed circuit board 11, respectively. Additionally, in turn from the resin top surface 11aTS of the resin layer 11a, each of the first metallic layer 11b and the second metallic layer 11c can be formed in a laminate structure of Au layer 11b3 and 11c3 having a thickness of approximately 0.1 μm, Ni layer 11b2 and 11c2 having a thickness of approximately 10 μm and Cu layer 11b1 and 11c1 having a thickness of approximately 160 μm.

Accordingly, Each of the top thicknesses 11bTT, 11cTT of the first metallic layer 11b and the second metallic layer 11c, which are formed on the resin top surface 11aTS of the resin layer 11a, can be 170 μm, and also each of the bottom thicknesses 11bBT, 11cBT of the first metallic layer 11b and the second metallic layer 11c, which are formed underneath the resin bottom surface 11aBS of the resin layer 11a, can be 100 μm while the resin thickness 11aT of the resin layer 11a may be 110 μm, as described above.

The frame 12 can be formed from a silicone resin including a light-reflecting material such as titanium oxide, zinc oxide, alumina used as a white filler and the like, and thereby the frame 12 can bear a light-reflecting function. The frame 12 can be located on the printed circuit board 11, can be extended toward the board bottom surface 11BS of the printed circuit board 11 and can be located in the third through holes 11a3, which pass through the resin layer 11a. Therefore, the frame 12, which is located on the board top surface 11TS of the printed circuit board 11 and extends toward the board bottom surface 11BS of the printed circuit board 11, can connect between the frame top surface 12TS and the frame bottom layer 12BL through the third through holes 11a3 while attaching to the printed circuit board 11 with confidence.

In addition, the resin package 10 can include the cavity 12a in a middle portion thereof from a top view of Z-axis. The semiconductor light-emitting device can mount a semiconductor light-emitting chip 13 such as a light emitting diode (LED) chip on the first metallic layer 11b exposed from the cavity 12a of the resin package 10 in a die-bonding process. The semiconductor light-emitting chip 13 can include: n-type semiconductor layer formed from n-type GaN in which Si and the like is doped; an emission layer made from a multiple quantum well structure, which includes a quantum well layer formed from InGaN and a barrier layer formed from GaN; p-type semiconductor layer formed from p-type GaN in which Mg and the like is doped; n-type electrode electrically connected to the n-type semiconductor layer; and p-type electrode electrically connected to the p-type semiconductor layer. The semiconductor light-emitting chip 13 can be, for example, a blue LED chip emitting blue light by applying a prescribed current between the p-type electrode and the n-type electrode.

By die-bonding the semiconductor light-emitting chip 13 on the first metallic layer 11b of the printed circuit board 11, one of the n-type electrode and the p-type electrode can be electrically connected to the first metallic layer 11b, and another of the n-type electrode and the p-type electrode can be electrically connected to the second metallic layer 11c of the printed circuit board 11 via a bonding wire 15. The encapsulating resin 14 can be disposed in the cavity 12a of the resin package 10 to encapsulate the semiconductor light-emitting chip 13, the bonding wire 15 and the like as shown in FIG. 1a.

The encapsulating resin 14 can include the silicone resin including a wavelength converting material such as a phosphor material of yttrium aluminum garnet $Y_3Al_5O_{12}$:Ce (YAG:Ce), etc. A part of the blue light emitted from the semiconductor light-emitting chip 13 can enter into the phosphor material, and can be wavelength-converted into a different wavelength from a wavelength of the blue light. Light having the different wavelength can be emitted from a device top surface of the encapsulating resin 14 (i.e. a light-emitting surface of the semiconductor light-emitting device) in an outward direction of the device along with another part of the blue light, which cannot enter into the phosphor material.

When the YAG:Ce is used as the wavelength converting material, the semiconductor light-emitting device can emit substantially white light by an additive color mixture of the excited yellow light emitted from the yellow phosphor material and the other part of the blue light emitted from the blue LED chip. In this case, light reached to the frame 12 in the lights emitted from the semiconductor light-emitting chip 13 can be reflected by the frame 32 having the light-reflecting function, and can be emitted from the device top surface of the encapsulating resin 14 in the outward direction of the semiconductor light-emitting device.

As shown in FIG. 1c and FIG. 1d, which are schematic side views showing the semiconductor light-emitting device in views from both directions of X-axis, in exemplary embodiments of the prevent invention, the frame bottom layer 12BL of the frame 12 can be located between the adjacent first metallic layers 11b, which are located underneath the resin bottom surface 11aBS of the resin layer 1a, and also can be located between the adjacent second metallic layers 11c, which are located underneath the resin bottom surface 11aBS of the resin layer 1a, because each of the first metallic layer 11b and the second metallic layers 11c separately extends toward a respective one of the first side surfaces 10XS, which are located on opposite side of the X-axis direction with respect to each other, as described later in detail.

When the semiconductor light-emitting device is mounted on a mounting surface of the device, soldering fillets 11bf can formed in both outward directions of the separated first metallic layers 11b underneath the resin bottom surface 11aBS of the resin layer 11a, as shown in FIG. 1c in a leftward side view of the device shown in FIG. 1a. Similarly, as shown in FIG. 1d in a rightward side view of the device shown in FIG. 1a, soldering fillets 11cf can formed in the both outward directions of the separated second metallic layers 11c underneath the resin bottom surface 11aBS of the resin layer 11a.

Accordingly, the semiconductor light-emitting device can be mounted on the mounting surface of the device with confidence, even when the frame bottom layers 12BL are located between the adjacent first metallic layers 11b and between the adjacent second metallic layers 11c. Additionally, the frame 12 can be disposed between at least one side surface of the first side surfaces 10XS and the second side surfaces 10YS and the first metallic layer 11b and the second metallic layer 11c in order to decrease a cutting surface of the first metallic layer 11b and the second metallic layer 11c as shown in FIG. 1a to FIG. 1d. Thereby, a heat generated from a blade of a cutting machine can decrease as described in the following description.

Figure 1F:
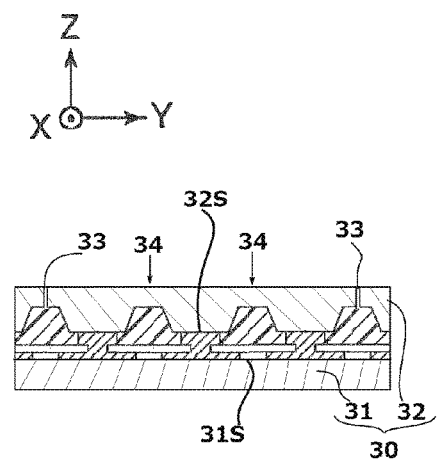

An exemplary manufacturing method for the above-described semiconductor light-emitting device will now be described with reference FIG. 1e to FIG. 1h. FIG. 1e is a schematic cross-sectional front view showing the exemplary manufacturing method in a view from a direction of Y-axis along X-axis, FIG. 1f is a schematic cross-sectional side view showing the exemplary manufacturing method in a view from a direction of X-axis along Y-axis, FIG. 1g is a schematic cross-sectional front view showing an individual resin package, and FIG. 1h is a schematic cross-sectional side view showing the individual resin package shown in FIG. 1g.

Process 1 is preparing the printed circuit board 11 including a plurality of the first and the second metallic layers 11b and 11c on/underneath one large resin layer 11a, and forming a plurality of the frames 12, the frame cavity layers 12CL and the frame bottom layers 12BL from the board top surface 11TS of the printed circuit board 11 toward the board bottom surface 11BS of the printed circuit board 11 via the third through hole 11a3 using a first mold 31 and a second mold 32 of a frame mold 30 having a gate 33 by a transfer molding method. In this case, a first molding surface 31S of the first mold 31 can correspond to the board bottom surface 11BS of the printed circuit board 11, and a second molding surface 32S of the second mold 32 can correspond to the board top surface 11TS of the printed circuit board 11.

In addition, the third through holes 11a3 can pass through only the resin layer 11a of the printed circuit board 11, and can be substantially surround by the first and the second metallic layers 11b and 11c on/underneath the one large resin layer 11a. Therefore, the frames 12, the frame cavity layers 12CL and the frame bottom layers 12BL can be formed by injecting the thermosetting resin of the frame 12 from the gate 33 of the frame mold 30 and by curing the resin in the frame mold 30. Thereby, a plurality of the resin packages 10 can be formed in the mold 30.

Figure 1G:
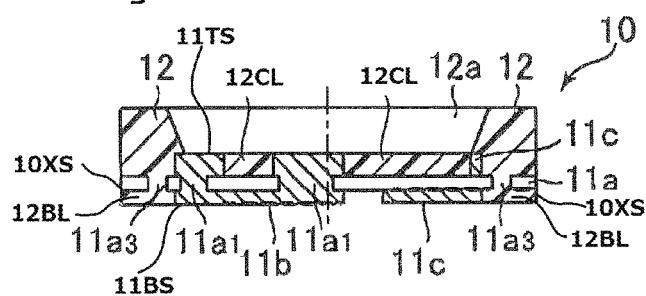
Figure 1H:
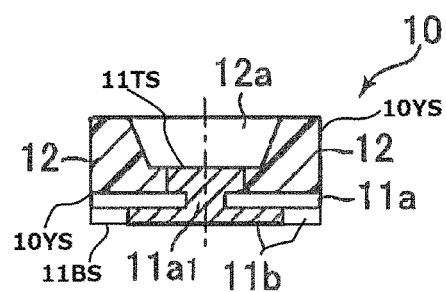
Figure 1H:
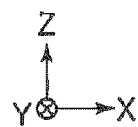
Figure 1H:
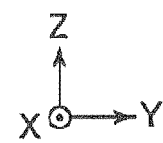

Process 2 is mounting the semiconductor light-emitting chip 13 on a plurality of the printed circuit boards 11 exposed from the cavity 12a of the resin package 10, and electrically connecting the semiconductor light-emitting chip 13 to each of the first metallic layer 11b and the second metallic layer 11c as shown in FIG. 1a, which shows the individual device in common with the individual resin package shown in FIG. 1g.

Process 3 is disposing a silicon resin including YAG phosphor material in a plurality of the cavities 12a, and forming the encapsulating resin 14 by curing the silicon resin.

Process 4 is cutting the pluralities of the printed circuits boards 11 and the frames 12 in individual devices along cutting surfaces 34, and manufacturing a plurality of the semiconductor light-emitting devices at once. Accordingly, the frame cavity layers 12CL of the frame 12, which can include the light-reflecting material, can be formed on only the resin top surface 11aTS of the printed circuit board 11 in the cavity 12a. The frame bottom layers 12BL can be formed so as to surround the respective one of the first side surfaces 10XS and either the first metallic layer 11b or the second metallic layer 11c of the printed circuit board 11 by cutting the pluralities of the printed circuits boards 11, and therefore can be formed so as to extend from the respective one of the first side surfaces 10XS toward the cavity 12a of the resin package 10 along the mounting surface of the device.

According to the semiconductor light-emitting device of the present invention, the printed circuit board 11 can include the resin layer 11a having the thickness 11aT of approximately 110 μm, can include each of the first metallic layer 11b having the top metallic thickness 11bTT of approximately 170 μm and the second metallic layer 11c having the top metallic thickness 11cTT of approximately 170 μm on the resin top surface 11aTS of the resin layer 11a, and also can include each of the first metallic layer 11b having the bottom metallic thickness 11bBT of approximately 100 μm and the second metallic layer 11c having the bottom metallic thickness 11cBT of approximately 100 μm underneath the resin bottom surface 11aBS of the resin layer 11a.

Therefore, each of totals of the first top metallic thickness 11bTT and the first bottom metallic thickness 11bBT of the first metallic layer 11b and the second top metallic thickness 11cTT and the second bottom metallic thickness 11cBT of the second metallic layer 11b can be thicker than the resin thickness 11aT of the resin layer 11a. Thereby, a quality of the semiconductor light-emitting device can improve. Specifically, a stiffness of the printed circuit board can increase by thickening the first metallic layer 11b and the second metallic layer 11c, and therefore the semiconductor light-emitting device can prevent the printed circuit board 11 from warping toward the frame 12 when forming the frame 12 on the printed circuit board 11.

For example, when carrying out a bonding-wire process using an ultrasound thermal compression bonding, because a bonding machine enables a stable bonding-wire, the semiconductor light-emitting device can improve a reliability thereof. Thickening the first metallic layer 11b and the second metallic layer 11c can result in an improvement of the reliability of the device because strengthening an intensity of the printed circuit board 11. Additionally, thickening the first metallic layer 11b and the second metallic layer 11c can also improve a radiation performance of the device.

In view of manufacturing cost, each of the totals of the first top metallic thickness 11bTT and the first bottom metallic thickness 11bBT of the first metallic layer 11b and the second top metallic thickness 11cTT and the second bottom metallic thickness 11cBT of the second metallic layer 11b can preferably be thinner than four times the thickness 11aT of the resin layer 11a. The thickness 11aT of the resin layer 11a can preferably be 50 μm or more in view of handlings in the manufacturing processes. The above-described exemplary embodiment can also provide effects other than those generated by thickening the first metallic layer 11b and the second metallic layer 11c.

Figure 6A:
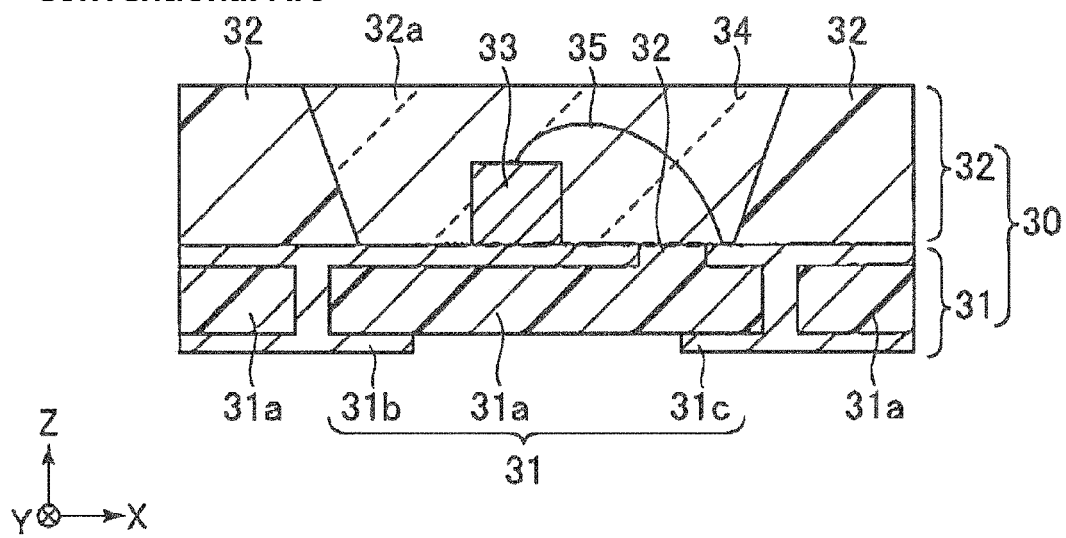
FIG. 6a is a schematic cross-sectional front view depicting a conventional semiconductor light-emitting device, in which the cross-sectional front view shows the device along a direction of X-axis as shown in FIG. 6a, and FIG. 6b is a schematic side view depicting the conventional semiconductor light-emitting device, and which shows the device from a direction of X-axis along Y-axis as shown in FIG. 6b.
Figure 6B:
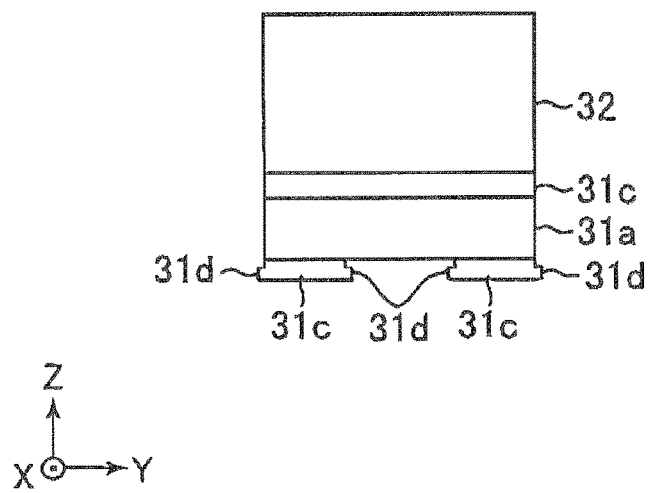

The frame cavity layer 12CL of the package 10 can be formed on the resin top surface 11aTS of the printed circuit board 11 unlike the frame 32 of the conventional semiconductor light-emitting device shown in FIGS. 6a and 6b. Therefore, even when a part of the light emitted from the semiconductor light-emitting chip 13 is entered into said legion of the resin layer 11a, the part of the light can be reflected with high efficiency by the frame cavity layer 12CL including a light-reflecting material in common with the frame 12. Therefore, the present invention may provide the semiconductor light-emitting device having a higher light-emitting efficiency than the conventional light-emitting device.

In addition, because the frame 12 can be formed from the silicone resin, in which the blue light causes little degradation, the semiconductor light-emitting device can prevent the frame 12 and the frame cavity layer 11CL from degrading the reflectance as compared with the conventional device in which the frame 32 is formed from, for example, the epoxy resin. Consequently, the present invention may provide the semiconductor light-emitting device having a higher light-emitting efficiency than the conventional light-emitting device even in view of that point.

Moreover, the semiconductor light-emitting device can prevent the printed circuit board 11 from warping toward the frame 12 when the frame 12 including the frame bottom layer 12BL extends on/underneath the resin layer 11a of the printed circuit board 11, because the frame 12 can be formed not only on the resin layer 11a of the printed circuit board 11 but also underneath the resin layer 11a of the printed circuit board 11 via the third through hole 11a3. Additionally, because a shrink of the silicone resin is smaller than that of the epoxy resin when the frame 12 solidifies and each of the frame bottom layers 12BL extend from the respective one of the first side surfaces 10XS toward the cavity 12a of the resin package 10 along the mounting surface in a longitudinal direction of the device, the frame 12 can result in an inhibition of warpage of the printed circuit board 11.

Besides, the burrs tend to take place when each of the metallic top thicknesses 11bTT, 11cTT and the metallic bottom thicknesses 11bBT, 11cBT becomes thicker, because a heat generated from the blade increases each expansion of the first metallic layer 11b and the second metallic layer 11c in Process 4, which is cutting the pluralities of the printed circuits boards 11 and the frames 12 in individual devices. However, in the exemplary embodiment of the prevent invention, each of the frame bottom layers 12BL of the frame 12 can be located between the separated first metallic layers 11b and between the separated second metallic layers 11C from the respective one of the first side surfaces 10XS of the device while it is located underneath the resin layer 11a of the printed circuit board 11.

Therefore, the heat generated from the blade can be dispersed by the frame bottom layer 12BL of the frame 12, and also can be dispersed in both outward directions of the first metallic layer 11b and in both outward directions of the second metallic layer 11c, as shown in FIG. 1c and FIG. 1d. Additionally, each of the first metallic layer 11b and second metallic layer 11c for causing the burrs can also enable not to extend from second side directions 10YS in an outward direction of the device so that the semiconductor light-emitting device can prevent each of the first metallic layer 11b and the second metallic layer 11c from causing the burrs as described later.

Moreover, when the semiconductor light-emitting device is mounted on a mounting surface of the device, the soldering fillets 11bf can formed in both outward directions of the separated first metallic layers 11b underneath the resin bottom surface 11aBS of the resin layer 11a. Similarly, the soldering fillets 11cf can formed in the both outward directions of the separated second metallic layers 11c underneath the resin bottom surface 11aBS of the resin layer 11a. Accordingly, the semiconductor light-emitting device can be mounted on the mounting surface of the device with confidence, even when each of the frame bottom layers 12BL are located between the adjacent first metallic layers 11b and between the adjacent second metallic layers 11c, respectively.

As described above, the exemplary embodiment of the present invention can provide the resin package 10 having a high quality and the semiconductor light-emitting device using the resin package 10 having the high quality. The exemplary structures of the resin package based upon the above-described embodiment will be described in more detail. The resin package 10 can include the frame 12, which extends from the frame top surface 12TS thereof toward the board bottom surface 12BS of the printed circuit board 11 and expands along a downward direction of the resin bottom surface 11aBS of the printed circuit board 11 while incorporating the printed circuit board. An exemplary first structure of the resin package will now described with reference to FIG. 2a to FIG. 2h.

Figure 2A:
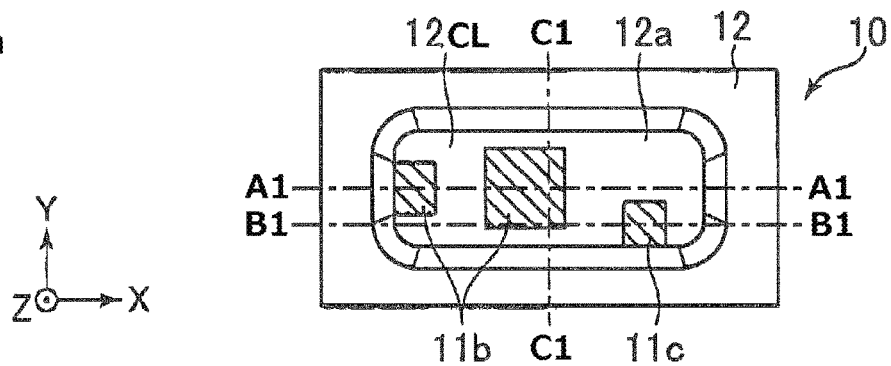
FIG. 2a is a schematic top view showing a first exemplary structure of a resin package of the semiconductor light-emitting device shown in FIG. 1a to FIG. 1d.
Figure 2B:
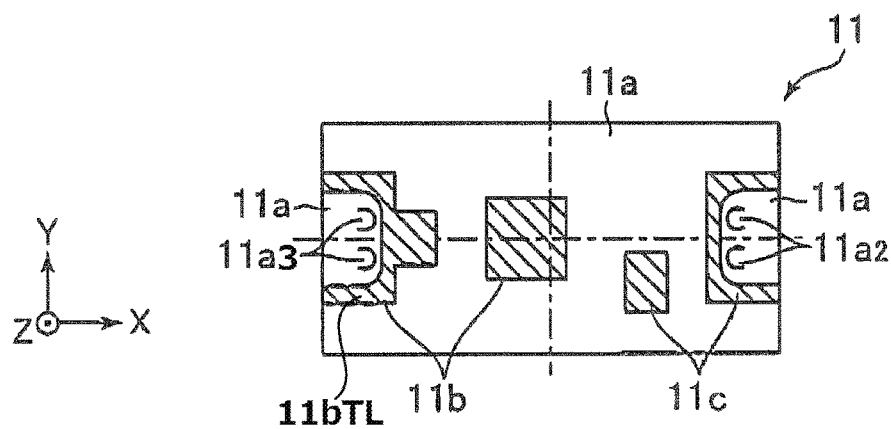
FIG. 2b is a schematic top view showing a first exemplary structure of the printed circuit board of the semiconductor light-emitting device.
Figure 2C:
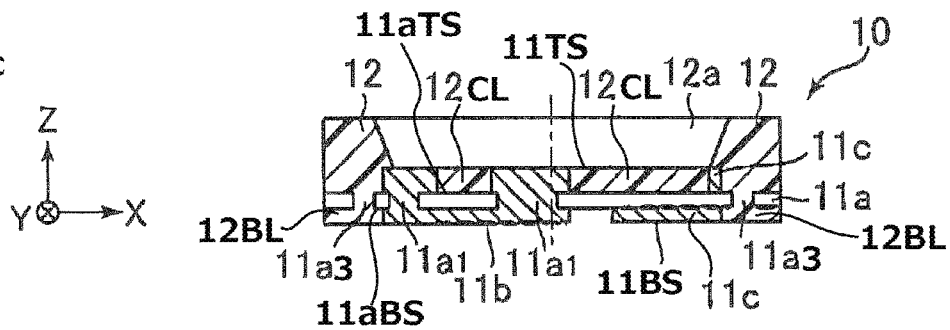
Figure 2D:
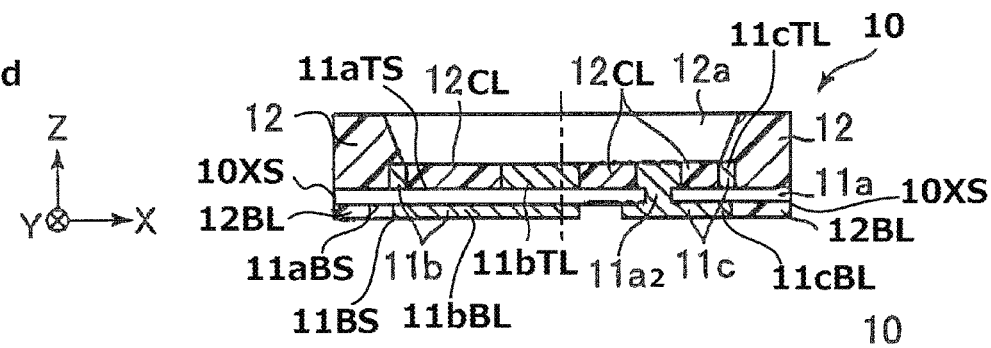
Figure 2E:
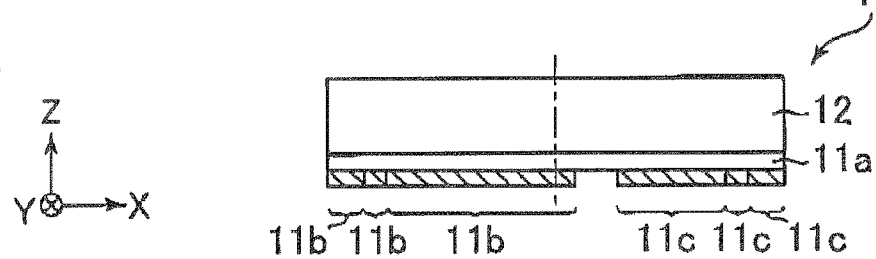
Figure 2F:
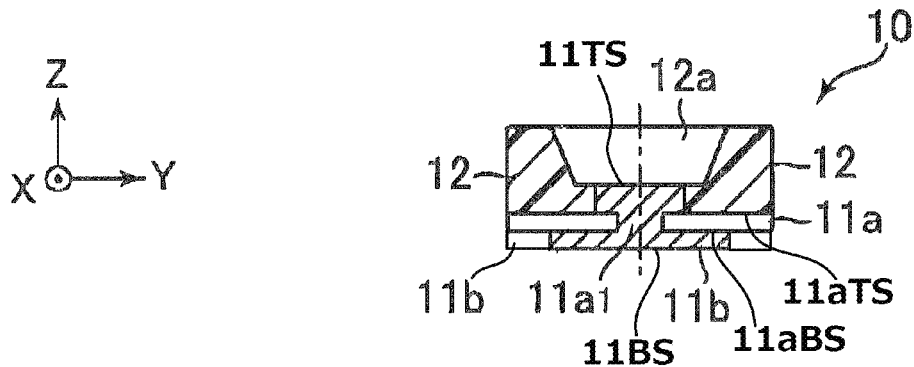

FIG. 2a is a schematic top view showing the first exemplary structure of the resin package 10, FIG. 2b is a schematic top view showing a first exemplary structure of the exemplary printed circuit board 11, FIG. 2c is a schematic cross-sectional front view showing the first exemplary structure of the resin package 10 taken along Line A1-A1 shown in FIG. 2a, FIG. 2d is a schematic cross-sectional front view showing the first exemplary structure of the resin package 10 taken along Line B1-B1 shown in FIG. 2a, FIG. 2e is a schematic front view showing the first exemplary structure of the resin package 10, and FIG. 2f is a schematic cross-sectional side view showing the first exemplary structure of the resin package 10 taken along Line C1-C1 shown in FIG. 2a.

Each of the resin package 10 and the printed circuit board 11 can be formed in a substantially rectangular shape. The printed circuit board 11 can include: the resin layer 11a; the first metallic layer 11b being electrically connected between a first top metallic layer 11bTL formed on the resin top surface 11aTS of the resin layer 11a and a first bottom metallic layer 11bBL formed underneath the resin bottom surface 11aBS of the resin layer 11a via the first through hole 11a1; the second metallic layer 11c being electrically connected between a second top metallic layer 11cTL formed on the resin top surface 11aTS of the resin layer 11a and a second bottom metallic layer 11cBL formed underneath the resin bottom surface 11aBS of the resin layer 11a via the second through hole 11a2, and being electrically insulated from the first metallic layer 11b; and the third through hole 11a3 connecting the frame 12 from the resin top surface 11aTS of the resin layer 11a toward the resin bottom surface 11aBS of the resin layer 11a and toward the board bottom surface 11BS of the printed circuit board 11 as shown in FIGS. 2c and 2d.

The resin package 10 can include the cavity 12a in the central portion thereof, in which the first metallic layer 11b and the second metallic layer 11c are exposed from the printed circuit board 11, and the frame cavity layer 12CL can be formed on the resin top surface 11aTS of the resin layer 11a other than the first metallic layer 11b and the second metallic layer 11c, which are exposed from the printed circuit board 11. Accordingly, the frame cavity layers 12CL can be formed on the resin top surface 11aTS of the printed circuit board 11 in the cavity 12a as shown in FIGS. 2a and 2c-2d, and also the frame bottom layers 12BL can be formed underneath the resin bottom surface 11aBS so as to extend from the respective one of the first side surfaces 10XS toward the cavity 12a as shown in FIG. 2d.

Figure 2G:
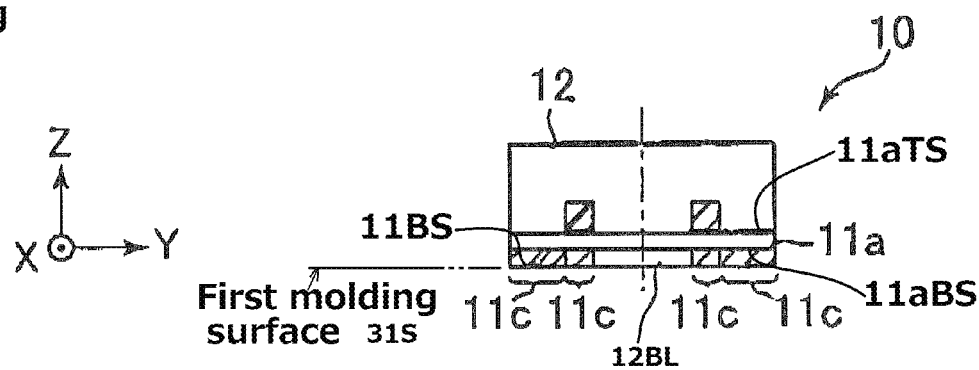
Figure 2H:
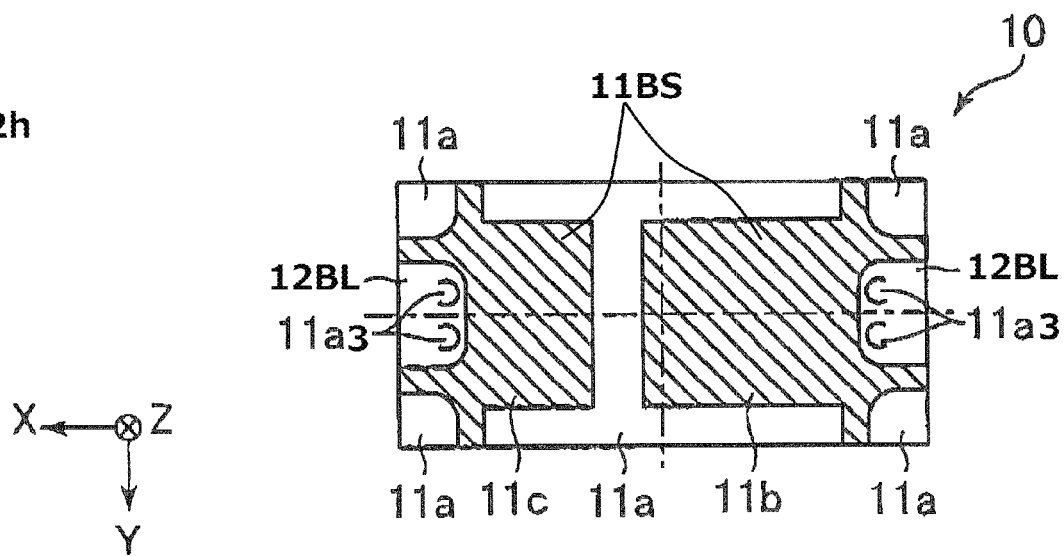

FIG. 2g shows a schematic side view of the first exemplary structure of the resin package 10, and FIG. 2h shows a schematic rear view of the first exemplary structure of the resin package 10. The resin package 10 can be manufactured by the transfer molding method so as to form the frame 12 as the frame cavity layer 12CL on the resin top surface 11aTS of the resin layer 11a other than the first metallic layer 11b and the second metallic layer 11c exposed from the printed circuit board 11 in the cavity 12a and so as to form the frame 12 as the frame bottom layer 12BL underneath parts of the resin bottom surface 11aBS of the resin layer 11a other than the first metallic layer 11b and the second metallic layer 11c exposed from the printed circuit board 11 via the third through holes 11a3.

In this case, the above-described parts of the resin bottom surface 11aBS of the resin layer 11a can located only between the separated two first metallic layers 11b and between the separated two second metallic layers 11c while each of the two first and the two second metallic layers 11b, 11c is electrically isolated as shown in FIGS. 2f-2h. Each of the first metallic layer 11b and the second metallic layer 11c can be exposed from the board bottom surface 11BS of the printed circuit board 11, and therefore can be used as an outer electrode of the semiconductor light-emitting device, respectively.

The reason why each of the first metallic layer 11b and the second metallic layer 11c can be exposed from the printed circuit board 11 in the cavity 12a in common with the frame cavity layer 12CV is that the board bottom surface 11BS of the printed circuit board 11 corresponds to the first molding surface 31S as described above, and also the reason why the frame bottom layer 12BL can located only between the separated two first metallic layers 11b and between the separated two second metallic layers 11c on the board bottom surface 11BS of the printed circuit board 11 is the same.

Figure 3A:
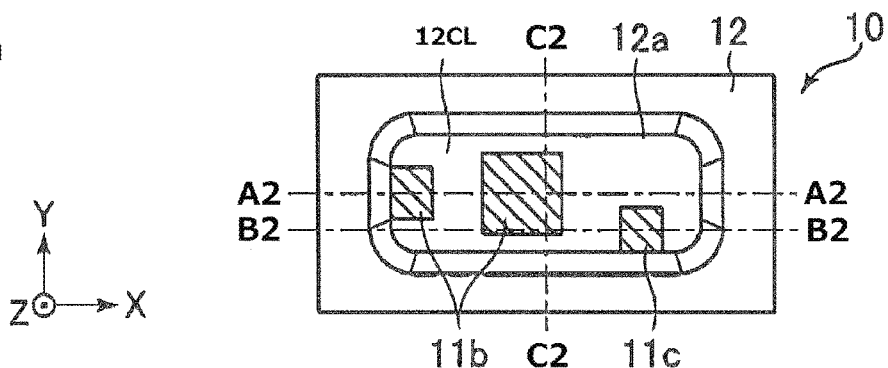
FIG. 3a is a schematic top view showing a second exemplary structure of the resin package of the semiconductor light-emitting device shown in FIG. 1a to FIG. 1d.
Figure 3B:
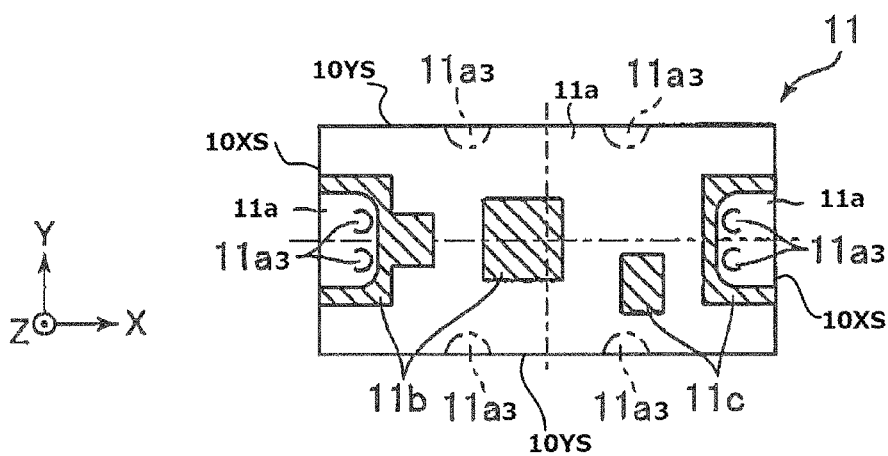
FIG. 3b is a schematic top view showing a second exemplary structure of the exemplary printed circuit board of the semiconductor light-emitting device.
Figure 3C:
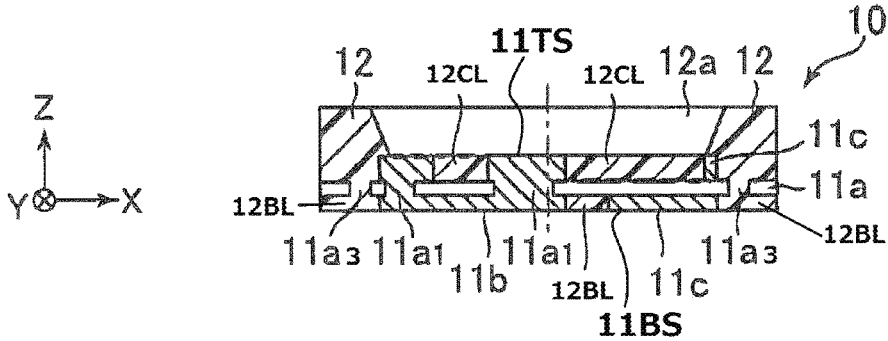
Figure 3D:
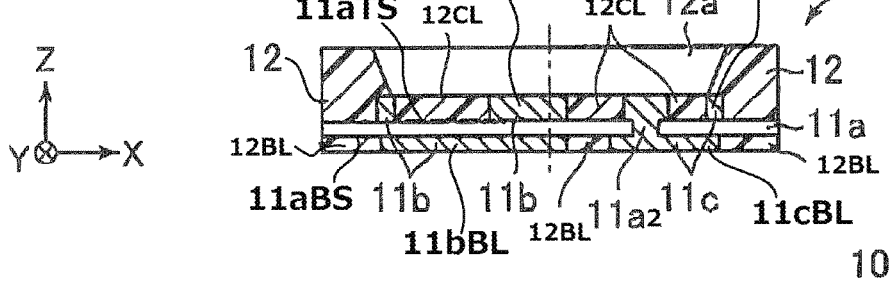
Figure 3E:
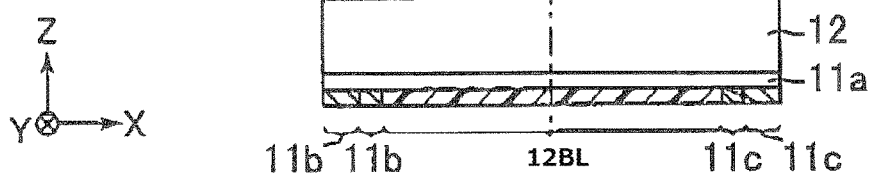
Figure 3F:
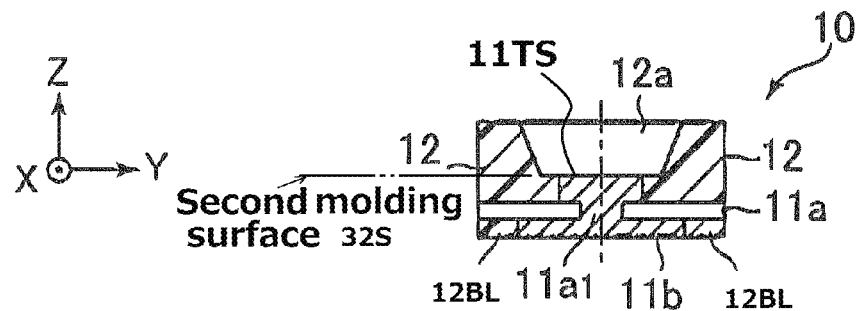
Figure 3G:
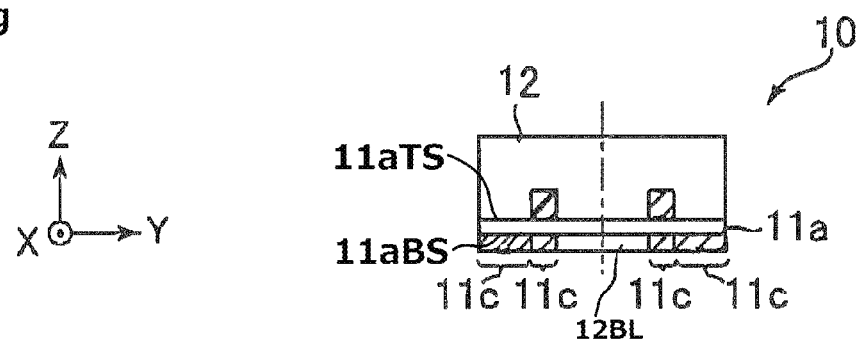

A second exemplary structure of the resin package will now be described with reference to FIG. 3a to FIG. 3h. FIG. 3a is a schematic top view showing the second exemplary structure of the resin package 10, FIG. 3b is a schematic top view showing a second exemplary structure of the exemplary printed circuit board 11, FIG. 3c is a schematic cross-sectional front view showing the second exemplary structure of the resin package 10 taken along Line A2-A2 shown in FIG. 3a, FIG. 3d is a schematic cross-sectional front view showing the second exemplary structure of the resin package 10 taken along Line B2-B2 shown in FIG. 3a, FIG. 3e is a schematic front view showing the second exemplary structure of the resin package 10, FIG. 3f is a schematic cross-sectional side view showing the second exemplary structure of the resin package 10 taken along Line C2-C2 shown in FIG. 3a, FIG. 3g is a schematic side view showing the second exemplary structure of the resin package 10, and FIG. 2h is a schematic rear view showing the second exemplary structure of the resin package 10.

Differences between the second exemplary structure of the resin package 10 and the first exemplary structure relate to the third through holes 11a3. The first exemplary structure can include the third through holes 11a3, which are surrounded by the respective one of the first side surfaces 10XS and either the first metallic layer 11b or the second metallic layer 11c. The second exemplary structure can further include the third through holes 11a3, which are located adjacent to at least one of the second side surfaces 10YS as shown in FIG. 3b. Accordingly, the frame bottom layer 12BL of the frame 12 can be formed underneath the resin bottom surface 11aBS of the resin layer 11a other than four corners of the resin bottom surface 11aSB while each of the first metallic bottom layer 11bBL of the first metallic layer 11b and the second metallic bottom layer 11cBL of the second metallic layer 11c is exposed from the board bottom surface 11BS of the printed circuit board 11 as shown in FIGS. 3c-3d and 3g-3h.

Therefore, the second structure can further include the third through holes 11a3, which are exposed from the second side surfaces 10YS, and thereby can further include the frame bottom layer 12BL connecting between the second side surfaces 10YS. The additional frame bottom layer 12BL connecting between the second side surfaces 10YS can enable the frame 12 to solidify attach to the printed circuit board 11, and therefore can prevent the printed circuit board 11 from causing the warp and the burrs even when the first metallic layer 11b and the second metallic layer 11c are cut in both directions of the first and the second side surfaces 10XS and 10YS in the cutting process described above as shown in FIG. 3h.

In addition, each side surface of the first metallic layer 11b and the second metallic layer 11c at the four corners of the devices can be exposed from the frame bottom surface 12BL. Accordingly, as described above with reference to FIGS. 1c and 1d, the soldering fillets 11bf and 11cf can be formed between the mounting surface of the device and each side surface of the first metallic layer 11b and the second metallic layer 11c at the four corners, and therefore can enable to the device to attach on the mounting surface with confidence.

In this case, the frame cavity layer 12CL can be formed as a substantially same level as the board top surface 11TS of the printed circuit board 11 as shown in FIG. 3c and FIG. 2c of the first exemplary structure. The reason can be that the board top surface 11TS of the printed circuit board 11 corresponds to the second molding surface 32S as shown in FIG. 3f and as described in the manufacturing method for the device.

Figure 4A:
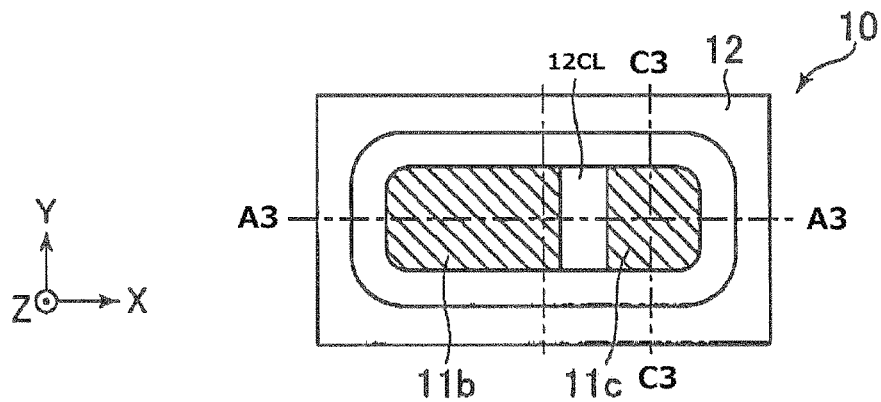
FIG. 4a is a schematic top view showing a third exemplary structure of the resin package of the semiconductor light-emitting device shown in FIG. 1a to FIG. 1d.
Figure 4B:
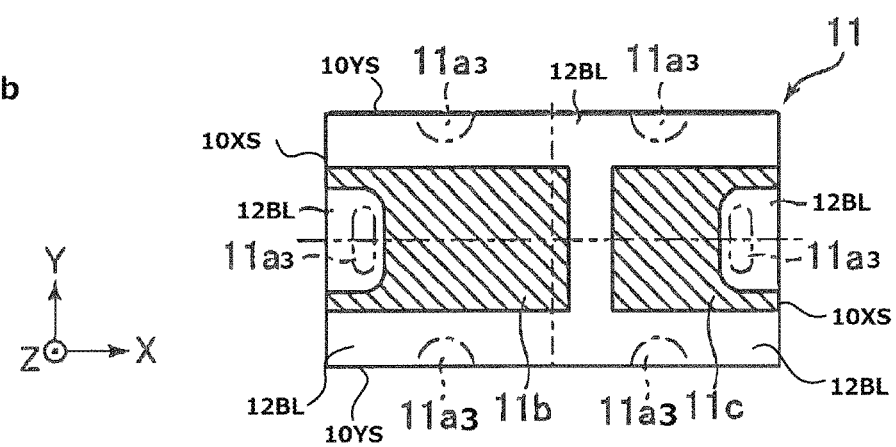
FIG. 4b is a schematic top view showing a third exemplary structure of the exemplary printed circuit board of the semiconductor light-emitting device.
Figure 4C:
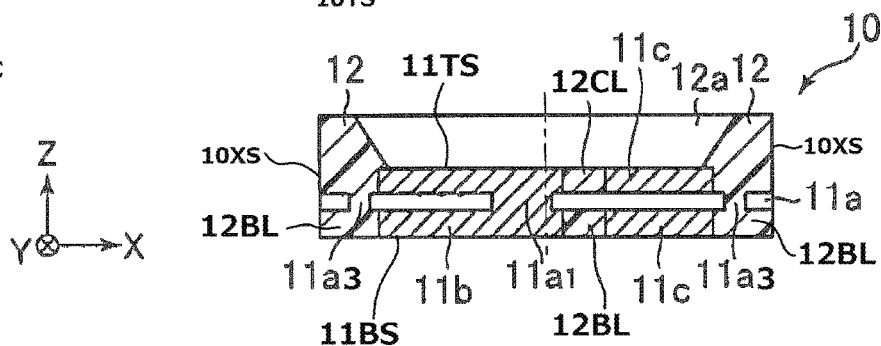
Figure 4D:
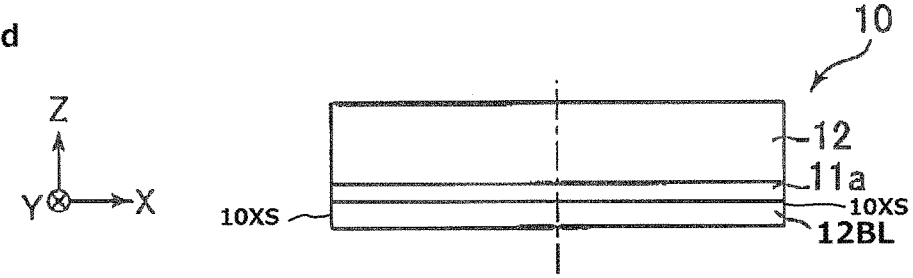
Figure 4E:
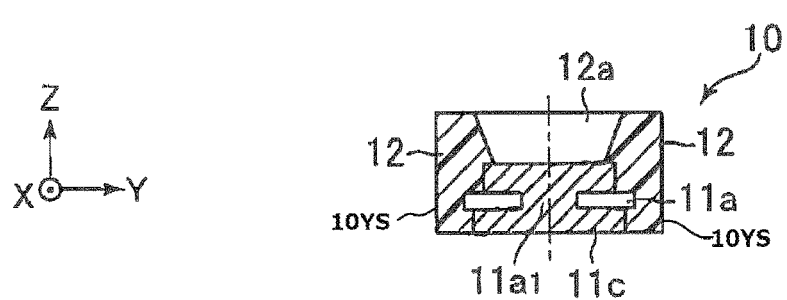
Figure 4F:
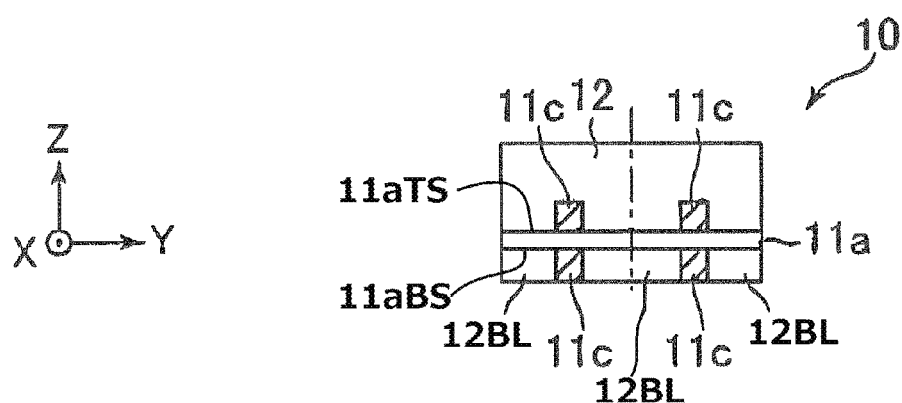
Figure 4G:
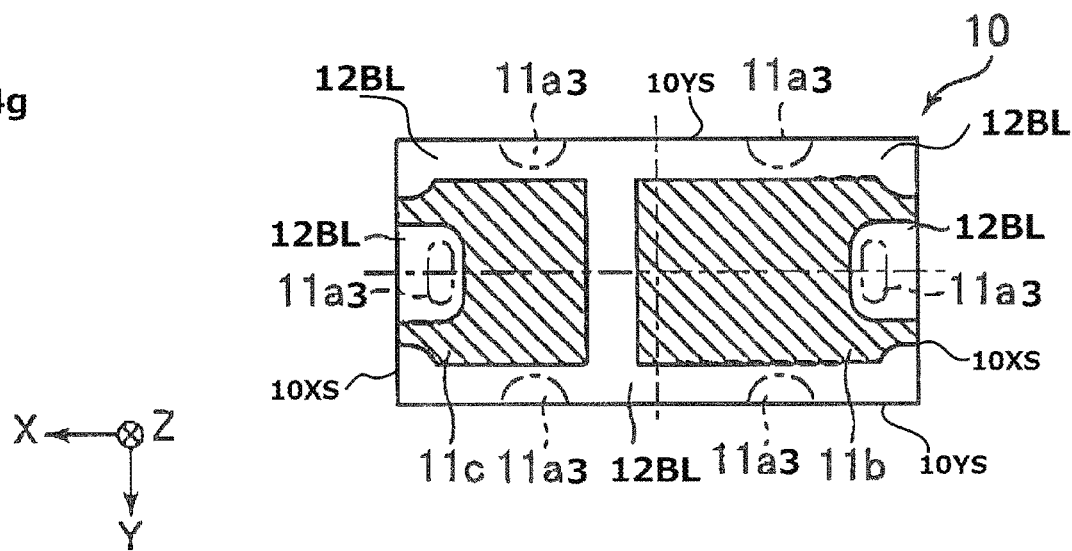

Next, a third exemplary structure of the resin package will now be described with reference to FIG. 4a to FIG. 4g. FIG. 4a is a schematic top view showing the third exemplary structure of the resin package 10, FIG. 4b is a schematic top view showing a third exemplary structure of the exemplary printed circuit board 11, FIG. 4c is a schematic cross-sectional front view showing the third exemplary structure of the resin package 10 taken along Line A3-A3 shown in FIG. 4a, FIG. 4d is a schematic front view showing the third exemplary structure of the resin package 10, FIG. 4e is a schematic cross-sectional side view showing the third exemplary structure of the resin package 10 taken along Line C3-C3 shown in FIG. 4a, FIG. 4f is schematic side view showing the third exemplary structure of the resin package 10, and FIG. 4g shows a schematic rear view of the third exemplary structure of the resin package 10.

Figure 3H:
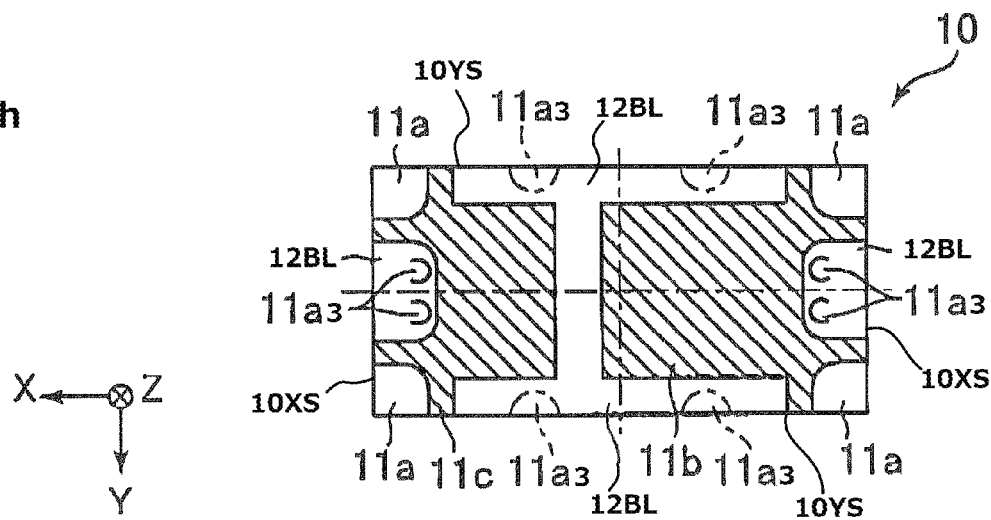

Differences between the third exemplary structure of the resin package 10 and the second exemplary structure relate to each shape of the first metallic layer 11b and the second metallic layer 11c. Especially, each of the first metallic layer 11b and the second metallic layer 11c extends to the second side surfaces 10YS underneath the resin bottom surface 11aBS of the resin layer 11a in the second exemplary structure as shown in FIGS. 3g and 3h, however, each of the first metallic layer 11b and the second metallic layer 11c cannot extend to the second side surfaces 10YS underneath the resin bottom surface 11aBS of the resin layer 11a in the third exemplary structure as shown in FIG. 4d to FIG. 4g.

Accordingly, the frame bottom layer 12BL of the frame 12 can be disposed under the resin bottom surface 11aBS of the resin layer 11a other than the first metallic layer 11b and the second metallic layer 11c in the third exemplary structure, and can connect to the frame top surface 12TS of the frame 12, which is a top surface of the device, from the mounting surface of the device as shown in FIGS. 1a and 1c. Therefore, the expanded frame bottom layer 12BL connecting between the top surface 12TS of the frame 12 and the mounting surface of the device, between the first side surfaces 10XS and between the second side surfaces 10YS can enable the frame 12 to solidify attach to the printed circuit board 11, and also can prevent the printed circuit board 11 from causing the warp and the burrs.

Figure 5A:
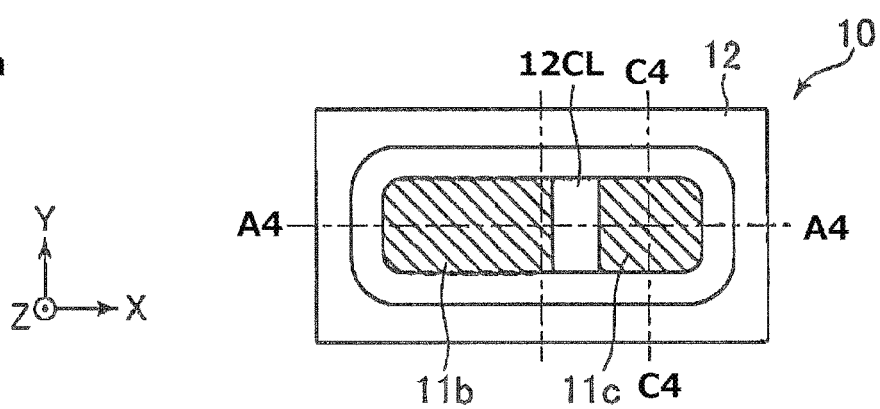
FIG. 5a is a schematic top view showing a fourth exemplary structure of the resin package of the semiconductor light-emitting device shown in FIG. 1a to FIG. 1d.
Figure 5B:
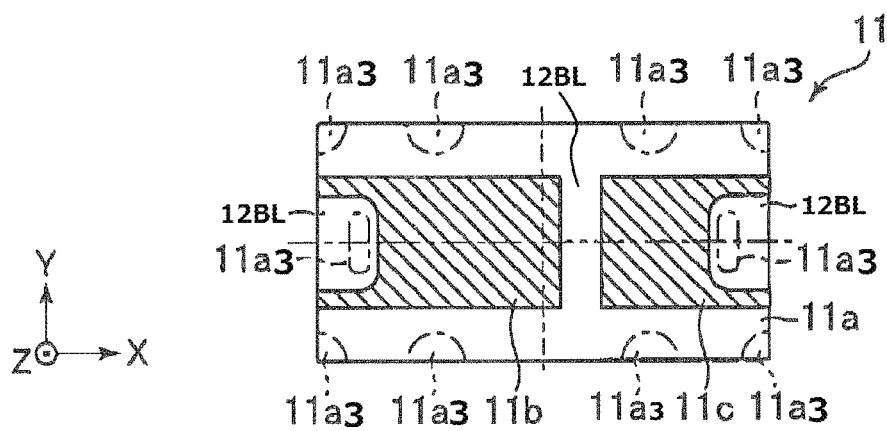
FIG. 5b is a schematic top view showing a fourth exemplary structure of the exemplary printed circuit board of the semiconductor light-emitting device.
Figure 5C:
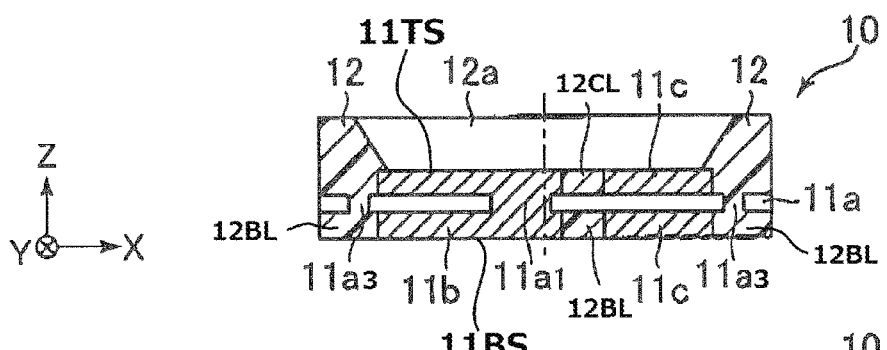
Figure 5D:
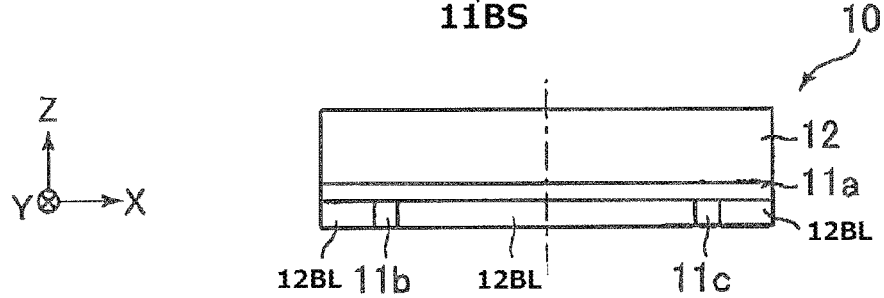
Figure 5E:
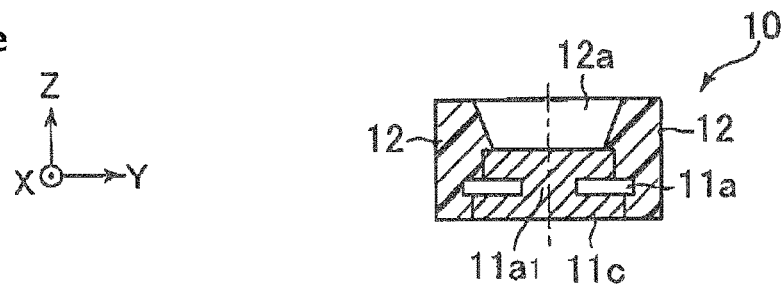
Figure 5F:
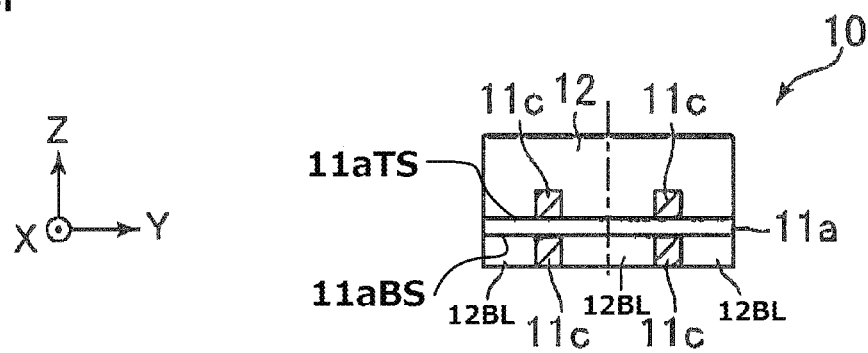

A fourth exemplary structure of the resin package will now be described with reference to FIG. 5a to FIG. 5g. FIG. 5a is a schematic top view showing the fourth exemplary structure of the resin package 10, FIG. 5b is a schematic top view showing a fourth exemplary structure of the exemplary printed circuit board 11, FIG. 5c is a schematic cross-sectional front view showing the fourth exemplary structure of the resin package 10 taken along Line A4-A4 shown in FIG. 5a, FIG. 5d is a schematic front view showing the fourth exemplary structure of the resin package 10, FIG. 4e is a schematic cross-sectional side view showing the fourth exemplary structure of the resin package 10 taken along Line C4-C4 shown in FIG. 5a, FIG. 5f is schematic side view showing the fourth exemplary structure of the resin package 10, and FIG. 4g shows a schematic rear view of the fourth exemplary structure of the resin package 10.

Figure 5G:
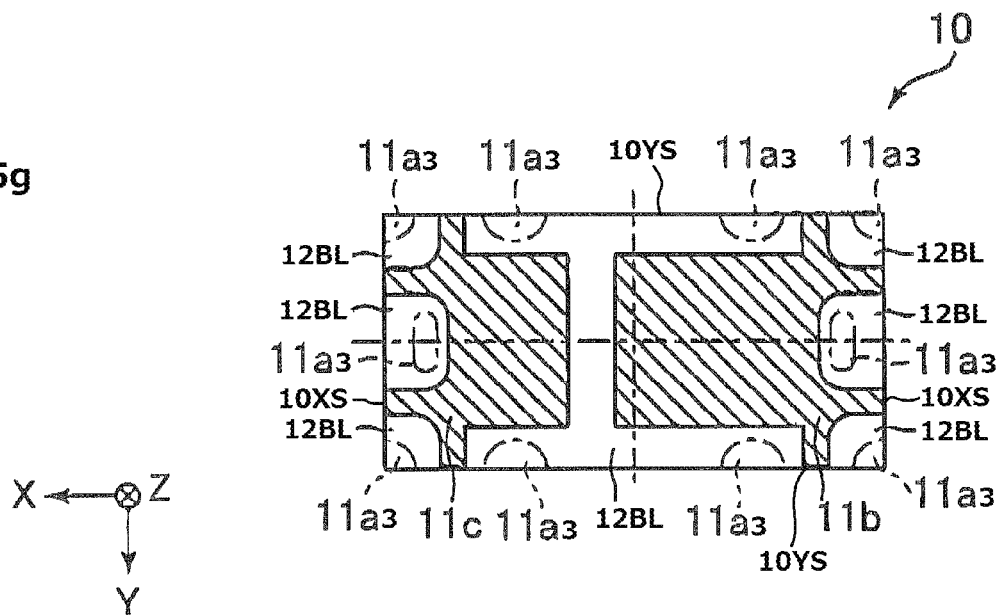

Differences between the fourth exemplary structure of the resin package 10 and the second exemplary structure relate to each location of the third through holes 11a3. Especially, the third through holes 11a3 are not located at the four corners of the printed circuit board 11 in the second exemplary structure as shown in FIG. 3h, however, the third through holes 11a3 can also be located at the four corners of the printed circuit board 11 as shown in FIGS. 5b and 5g of the fourth exemplary structure.

Accordingly, the frame bottom layer 12BL of the frame 12 can also be disposed under the resin bottom surface 11aBS of the resin layer 11a other than the first metallic layer 11b and the second metallic layer 11c in the fourth exemplary structure in common with the third exemplary structure. Therefore, the fourth exemplary structure can also enable the frame 12 to solidify attach to the printed circuit board 11, and also can prevent the printed circuit board 11 from causing the warp and the burrs. Additionally, the soldering fillets 11bf and 11cf show in FIGS. 1c and 1d can be formed from each of the first metallic layer 11b and the second metallic layer 11c in the outward directions of the first side surfaces 10XS and the second side surfaces 10YS.

Various modifications of the above disclosed embodiments can be made without departing from the spirit and scope of the presently disclosed subject matter. For example, cases where LED chip is used as the semiconductor light-emitting chip are described. However, the light-emitting chip is not limited to the LED chip, and a laser diode and the like can be used. In addition, the specific arrangement between components can vary between different applications, and several of the above-described features can be used interchangeably between various embodiments depending on a particular application of the grommet.

While there has been described what are at present considered to be exemplary embodiments of the invention, it will be understood that various modifications may be made thereto, and it is intended that the appended claims cover such modifications as fall within the true spirit and scope of the invention. All conventional art references described above are herein incorporated in their entireties by reference.

What is claimed is:

1. A semiconductor light-emitting device, comprising:
   a printed circuit board including a resin layer having a resin top surface and a resin bottom surface, and including metallic layers provided above the resin top surface of the resin layer and underneath the resin bottom surface of the resin layer;
   a semiconductor light-emitting chip disposed on a board top surface of the printed circuit board; and
   a frame comprising a first portion arranged above the board top surface of the printed circuit board and further comprising a second portion arranged at a board bottom surface of the printed circuit board and extending underneath the resin bottom surface of the resin layer at a position underneath the resin bottom layer where the metallic layers are not provided;
   wherein:
   the metallic layers include a first metallic layer and a second metallic layer that are insulated with respect to each other;
   each of the first metallic layer and the second metallic layer includes a top-surface electrode layer disposed on the resin top surface of the resin layer and a bottom-surface electrode layer disposed on the resin bottom surface of the resin layer, wherein the top-surface electrode layer and the bottom-surface electrode layer are electrically connected to each other through a through hole that passes through the resin layer from the resin top surface to the resin bottom surface;
   the bottom-surface electrode layer of each of the first metallic layer and the second metallic layer includes a branching area so that two portions of the bottom-surface electrode layer are exposed on side surface of the semiconductor light-emitting device;
   the frame is formed from a silicone resin including a light-reflecting material and includes a top-surface frame disposed on the resin top surface of the resin layer and a bottom-surface frame disposed on the resin bottom surface of the resin layer that are connected at least through a through hole for the frame that passes through the resin layer from the resin top surface to the resin bottom surface, wherein the top-surface frame has a substantially rectangular shape and includes a cavity in a central portion thereof;
   the semiconductor light-emitting chip is mounted on the printed circuit board within the cavity, and one of an n-type electrode and a p-type electrode of the semiconductor light-emitting chip is electrically connected to the first metallic layer and the other of the n-type electrode and the p-type electrode of the semiconductor light-emitting chip is electrically connected to the second metallic layer;

the through hole for the frame is located below the top-surface frame that has a rectangular shape;

the bottom-surface frame is located below the top-surface frame and is disposed in a region of at least one side surface of the semiconductor light-emitting device so that the bottom-surface frame is disposed in between the two portions of the bottom-surface electrode layer of each of the first and second metallic layers so as to be in contact with the first metallic layer and the second metallic layer;

a thickness of the top-surface electrode layer of each of the first metallic layer and the second metallic layer is greater than a thickness of the bottom-surface electrode layer of each of the first metallic layer and the second metallic layer; and a total thickness of the top-surface electrode layer and the bottom-surface electrode layer is greater than a thickness of the resin layer.

2. The semiconductor light-emitting device according to claim 1, wherein the total thickness of the top-surface electrode layer of each of the first metallic layer and the second metallic layer and the bottom-surface electrode layer of each of the first metallic layer and the second metallic layer is less than four times the thickness of the resin layer.

3. The semiconductor light-emitting device according to claim 1, wherein the thickness of the resin layer is at least 50 μm.

4. The semiconductor light-emitting device according to claim 2, wherein the thickness of the resin layer is at least 50 μm.

5. The semiconductor light-emitting device according to claim 1, wherein the frame is located underneath the resin bottom surface of the resin layer and at corners so as to be in contact with the first metallic layer or the second metallic layer.

6. The semiconductor light-emitting device according to claim 1, wherein the frame is located on the resin top surface of the resin layer other than the first and second metallic layers exposed in the cavity.

* * * * *